United States Patent
Graham et al.

(10) Patent No.: US 8,878,314 B2
(45) Date of Patent: Nov. 4, 2014

(54) MEMS PACKAGE OR SENSOR PACKAGE WITH INTRA-CAP ELECTRICAL VIA AND METHOD THEREOF

(75) Inventors: Andrew B. Graham, Redwood City, CA (US); Gary Yama, Mountain View, CA (US); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 239 days.

(21) Appl. No.: 13/425,543

(22) Filed: Mar. 21, 2012

(65) Prior Publication Data

US 2012/0261774 A1  Oct. 18, 2012

Related U.S. Application Data

(60) Provisional application No. 61/475,507, filed on Apr. 14, 2011.

(51) Int. Cl.
*H01L 29/84* (2006.01)
*B81B 7/00* (2006.01)

(52) U.S. Cl.
CPC .......... *B81B 7/007* (2013.01); *B81B 2207/092* (2013.01); *B81B 2207/095* (2013.01)
USPC ............ 257/415; 257/E29.324; 257/E21.002; 438/50

(58) Field of Classification Search
CPC ............ B81C 1/00333; B81C 1/00301; G01P 15/123; B81B 7/007; H01L 21/7682; H01L 23/473; H01L 23/481
USPC ....................................................... 257/415
See application file for complete search history.

(56) References Cited

U.S. PATENT DOCUMENTS

| | | | |
|---|---|---|---|
| 6,054,377 A | 4/2000 | Filipiak et al. |
| 6,069,398 A | 5/2000 | Kadosh et al. |
| 6,123,179 A | 9/2000 | Chen |
| 7,704,881 B2 | 4/2010 | Klootwijk et al. |
| 2008/0266787 A1 | 10/2008 | Gosset et al. |
| 2008/0315430 A1 | 12/2008 | Weber et al. |
| 2009/0261430 A1 | 10/2009 | Suzuki et al. |

(Continued)

FOREIGN PATENT DOCUMENTS

EP  1640334  3/2006

OTHER PUBLICATIONS

PCTUS2012050813 International Search Report and Written Opinion mailed on Sep. 19, 2012, 9 pages.

*Primary Examiner* — David Vu
*Assistant Examiner* — Jonathan Han
(74) *Attorney, Agent, or Firm* — Michael Best & Friedrich LLP

(57) ABSTRACT

A MEMS device structure including a lateral electrical via encased in a cap layer and a method for manufacturing the same. The MEMS device structure includes a cap layer positioned on a MEMS device layer. The cap layer covers a MEMS device and one or more MEMS device layer electrodes in the MEMS device layer. The cap layer includes at least one cap layer electrode accessible from the surface of the cap layer. An electrical via is encased in the cap layer extending across a lateral distance from the cap layer electrode to the one or more MEMS device layer electrodes. An isolating layer is positioned around the electrical via to electrically isolate the electrical via from the cap layer.

18 Claims, 7 Drawing Sheets

(56) References Cited

U.S. PATENT DOCUMENTS

| | | |
|---|---|---|
| 2009/0267166 A1 | 10/2009 | Verheijden et al. |
| 2010/0096713 A1* | 4/2010 | Jung .......................... 257/415 |
| 2010/0176465 A1* | 7/2010 | Yama et al. ................ 257/415 |
| 2010/0240163 A1* | 9/2010 | Candler et al. ............... 438/51 |
| 2010/0294633 A1* | 11/2010 | Nakatani et al. ............ 200/181 |
| 2011/0031581 A1 | 2/2011 | West |

* cited by examiner ns set forth in the following description or illustrated in the following drawings. The invention is capable of other embodiments and of being practiced or of being carried out in various ways.

MEMS PACKAGE OR SENSOR PACKAGE WITH INTRA-CAP ELECTRICAL VIA AND METHOD THEREOF

RELATED APPLICATIONS

The present application claims priority to U.S. Provisional Application No. 61/475,507 filed on Apr. 14, 2011, the entire contents of which are incorporated herein by reference.

BACKGROUND

The disclosure relates to MEMS packages or sensor packages.

SUMMARY

Embodiments provided by this disclosure include an electrically isolated, lateral silicon via buried in the cap layer of a sensor package. The buried, but accessible, via runs laterally through the cap portion of a feature created by an encapsulation process. The via uses a plug to make contact to an electrode in the structural layer below the cap layer. Electrical contact is made to the lateral via by means of an additional plug that runs to the top of the cap where metal can then be deposited or the via can be routed to another location.

Embodiments provided by this disclosure allow smaller electrode contacts to be used in a sensor package. The electrode contacts can be tied together and run laterally without external exposure. A dielectric coating layer allows for a smaller contact to the electrode, placing the larger external contact—such as a metal bond pad, for example—in another location. The insulated lateral via electrically connects multiple electrodes through the cap even though the electrodes are physically separate in the structural layer of the device. The use of a buried electrical via prevents exposure of the connections to the external environment. The dielectric coating around the via can provide additional electrical shielding, improving device performance.

In one embodiment, the disclosure describes a MEMS device structure including a lateral electrical via encased in a cap layer. The MEMS device structure includes a cap layer positioned on a MEMS device layer. The cap layer covers a MEMS device and one or more MEMS device layer electrodes in the MEMS device layer. The cap layer includes at least one cap layer electrode accessible from the surface of the cap layer. An electrical via is encased in the cap layer extending across a lateral distance from the cap layer electrode to the one or more MEMS device layer electrodes. An isolating layer is positioned around the electrical via to electrically isolate the electrical via from the cap layer.

In some embodiments, the MEMS device structure also includes a handle layer positioned adjacent to the MEMS device layer opposite the cap layer. One or more electrode anchors extend from each of the one or more MEMS device layer electrodes anchoring the one or more MEMS device layer electrodes in the handle layer.

In some embodiments, the electrical via is only partially encased in the cap layer. In such embodiments, the isolating layer covers all surfaces of the electrical via that are encased in the cap layer. In some embodiments, the cap layer is separated from the MEMS device layer by an air gap. In some such embodiments, a portion of the electrical via is exposed within the air gap between the cap layer and the MEMS device layer.

In another embodiment, the disclosure describes a method of manufacturing a MEMS device structure that includes a cap layer positioned on a MEMS device layer. The MEMS device structure manufactured according to this method includes a lateral electrical via encased in the cap layer and extending from a cap layer electrode to one or more MEMS device layer electrodes. The method includes depositing a separation layer on the MEMS device layer. The separation layer is then etched to expose the one or more MEMS device electrodes through the separation layer. A cap layer material is then deposited on the separation layer. The cap layer material fills the etched portion of the separation layer and contacts the one or more MEMS device layer electrodes. The cap layer material is then etched to define and separate an electrical via in the cap layer material. The etching forms a gap between the electrical via and the remaining cap layer material. The electrical via includes the portion of the cap layer material that contacts the one or more MEMS device layer electrodes. A dielectric material is then deposited on the cap layer material covering the surface of the cap layer material opposite the MEMS device layer and filling the gaps separating the electrical via from the remaining cap layer material. The dielectric material electrically isolates the electrical via from the remaining cap layer material. The dielectric material is then etched to expose a portion of the electrical via at the location of the cap layer electrode.

In some embodiments, the separation layer includes a sacrificial silicon dioxide layer. The sacrificial silicon dioxide material is removed by release etching forming an air gap between the MEMS device layer and the cap layer.

Other aspects of the described embodiments will become apparent by consideration of the detailed description and accompanying drawings.

DETAILED DESCRIPTION

Before any embodiments are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
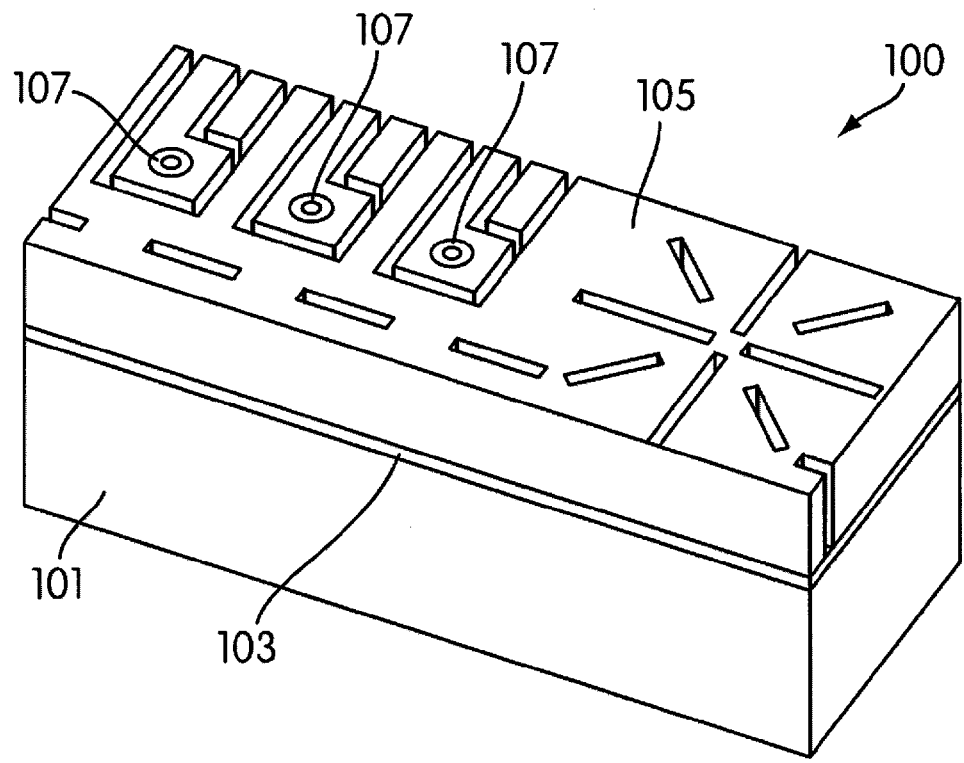
FIG. 1 is a perspective view of a device with an exposed structural layer according to one embodiment.

A lateral electrical via in a cap layer of a MEMS device 100 (or other type of sensor) as described below provides access to electrical contacts in the device layer. As illustrated in FIG. 1, a silicon handle wafer 101 forms the base and bottom surface of the structure. A buried oxide layer 103 separates the silicon handle wafer 101 from a device layer 105. The device layer 105 includes a microelectromechanical system (MEMS) and may include sensors or other devices. In the example illustrated in FIG. 1, the MEMS device layer 105 includes three electrodes 107. The electrodes 107 are connected to anchoring posts (not pictured in FIG. 1, shown below in FIG. 13) that extend through the buried oxide layer 103 and into the silicon handle wafer 101.

Figure 2:
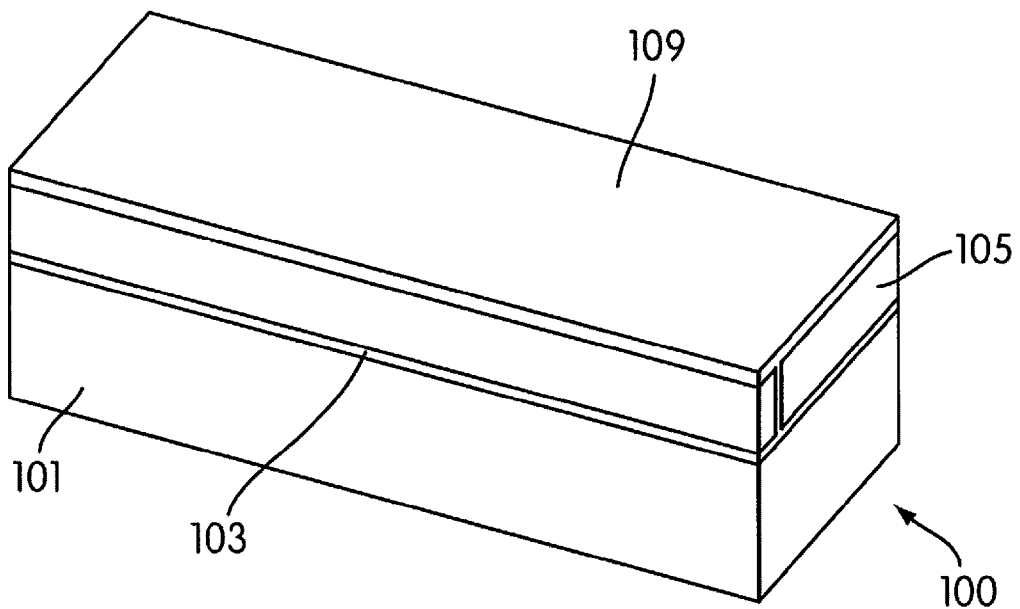
FIG. 2 is a perspective view of the device of FIG. 1 after the deposition of a sacrificial layer.
Figure 3:
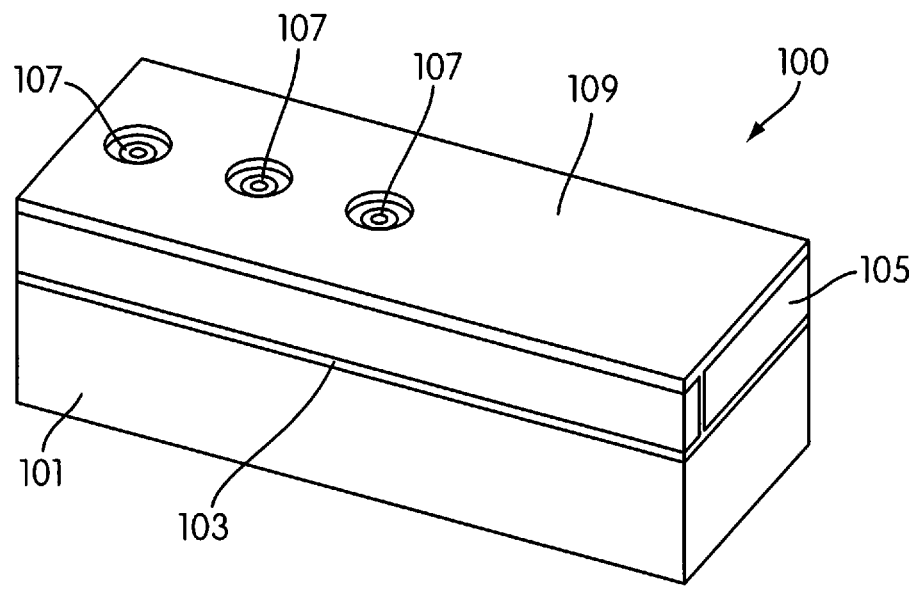
FIG. 3 is a perspective view of the device of FIG. 2 after openings to the electrodes are provided through the sacrificial layer.

As illustrated in FIG. 2, a sacrificial layer 109 is deposited on the device layer 105. The material of the sacrificial layer 109 can include, for example, silicon dioxide, silicon nitride, or other materials. The sacrificial layer 109 extends into and fills gaps in the device layer 105. As illustrated in FIG. 3, the sacrificial layer 109 is etched to expose the electrodes 107 on the device layer 105.

Figure 4:
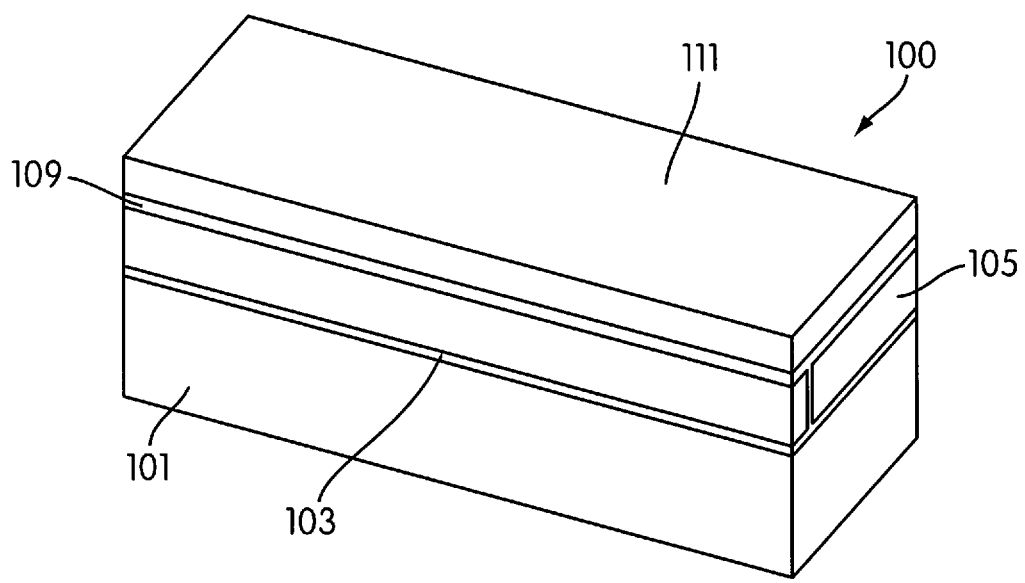
FIG. 4 is a perspective view of the device of FIG. 3 after a cap layer is deposited.
Figure 5:
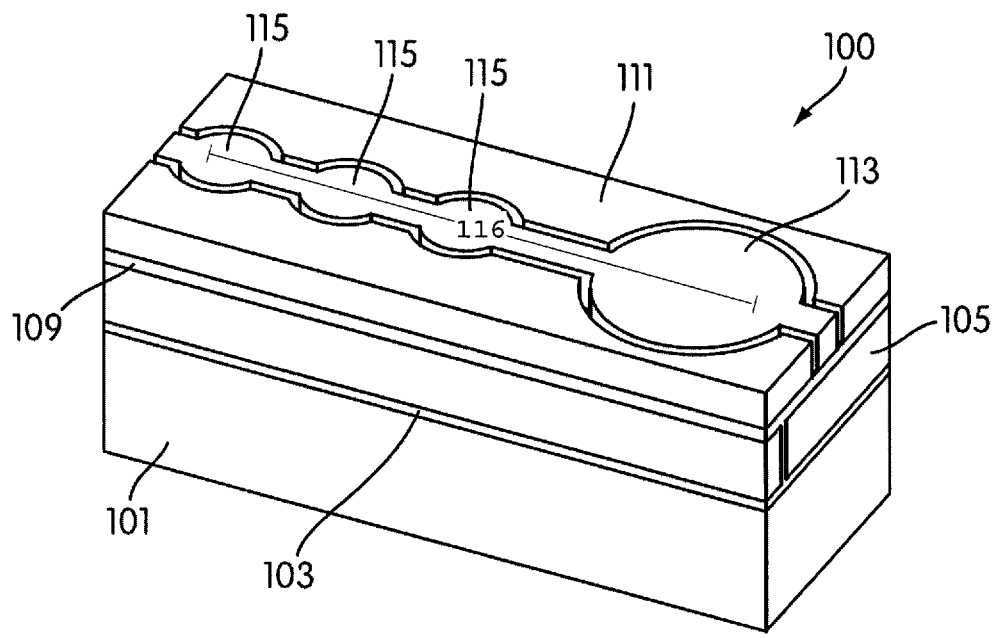
FIG. 5 is a perspective view of the device of FIG. 4 after an electrical via is etched into the cap layer.

In FIG. 4, doped silicon 111 is deposited on top of the sacrificial layer 109. The doped silicon 111 serves as part of the cap layer as described below. The sacrificial layer 109 serves as a separation layer between the MEMS device layer 105 and the doped silicon 111 of the cap layer. As described in detail below, in some embodiments, the doped silicon 111 is removed to form an air gap between the MEMS device layer 105 and the cap layer 111. The electrodes 107 are buried under the doped silicon 111. However, as illustrated in FIG. 5, the doped silicon 111 is etched in the pattern of the intra-cap electrical via, defining an electrode layout 115 and a contact layout 113. The electrode layout 115 is formed in the cap layer material proximal to the electrodes 107 of the device layer. In the examples described herein, the device layer and, therefore, the electrode layout 115 includes three electrodes 107. The contact layout 113 is formed in the cap layer material proximal to the future location of an external contact that will ultimately be located on the external surface of the package (as described below). The intra-cap electrical via allows for external access to the electrical via when the electrical via is formed. As shown by the etchings of the electrode layout 115 and the contact layout 113 in FIG. 5, the intra-cap electrical via, when formed, will extend across a lateral distance 116 from the external contact to each of the three electrodes 107.

Figure 6:
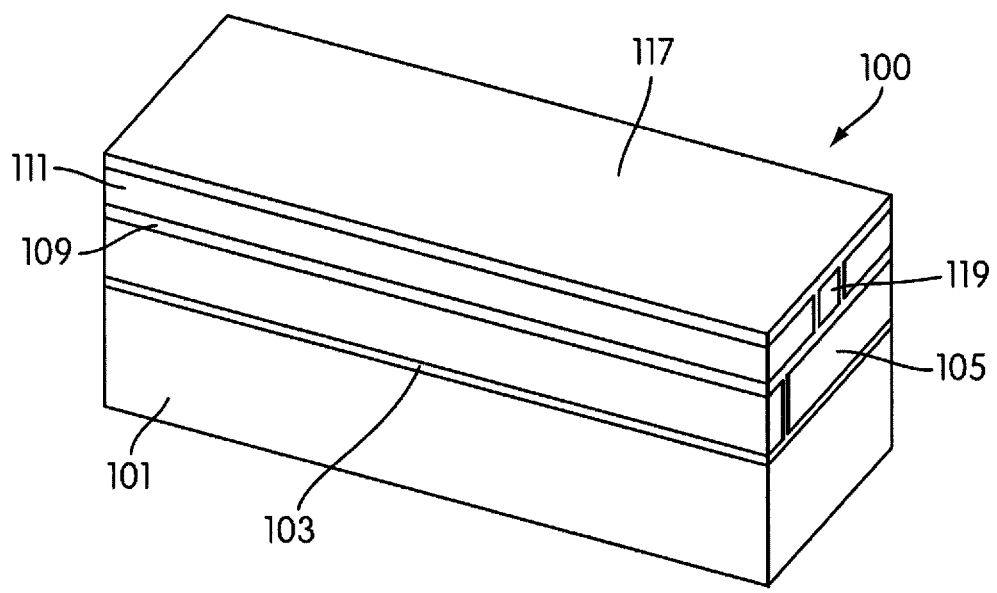
FIG. 6 is a perspective view of the device of FIG. 5 after a dielectric material is deposited on the cap layer.
Figure 7:
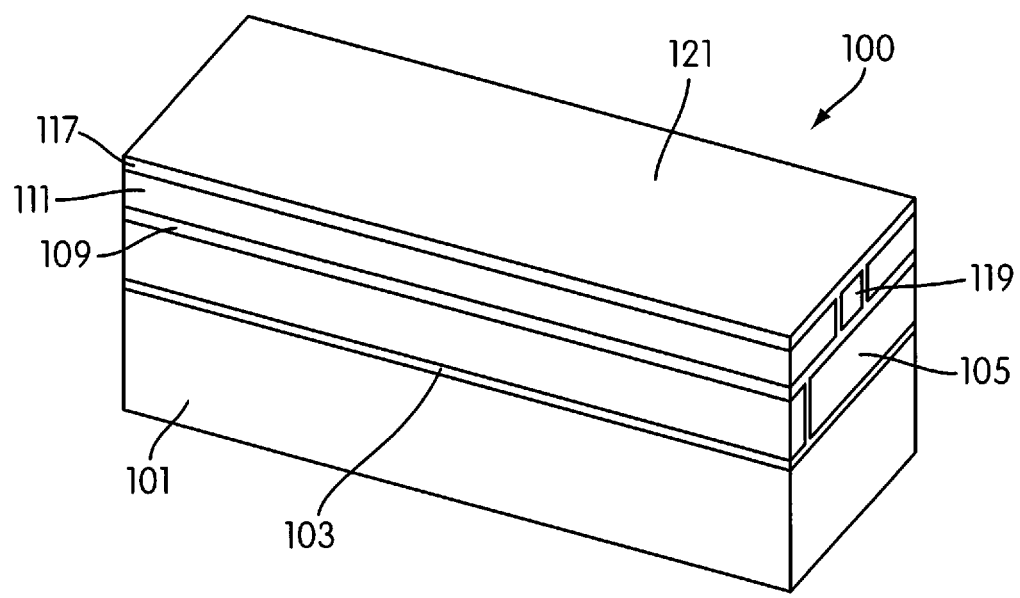
FIG. 7 is a perspective view of the device of FIG. 6 after the deposition of a etch stop layer.

As illustrated in FIG. 6, a dielectric material 117 is added on top of the doped silicon 111. The material 117 can include a single material or multiple materials, such as silicon dioxide, silicon nitride, or other materials suitable for the application. The dielectric material 117 covers the doped silicon 111 and extends into the etched trenches defining the electrical via. As a result, a silicon via 119 is defined and isolated by the dielectric material 117 in the doped silicon 111 of the cap layer. In FIG. 7, an additional SiO$_2$ layer 121 is deposited on top of the dielectric material 117. The SiO$_2$ layer 121 will later be used as an etch stop.

Figure 8:
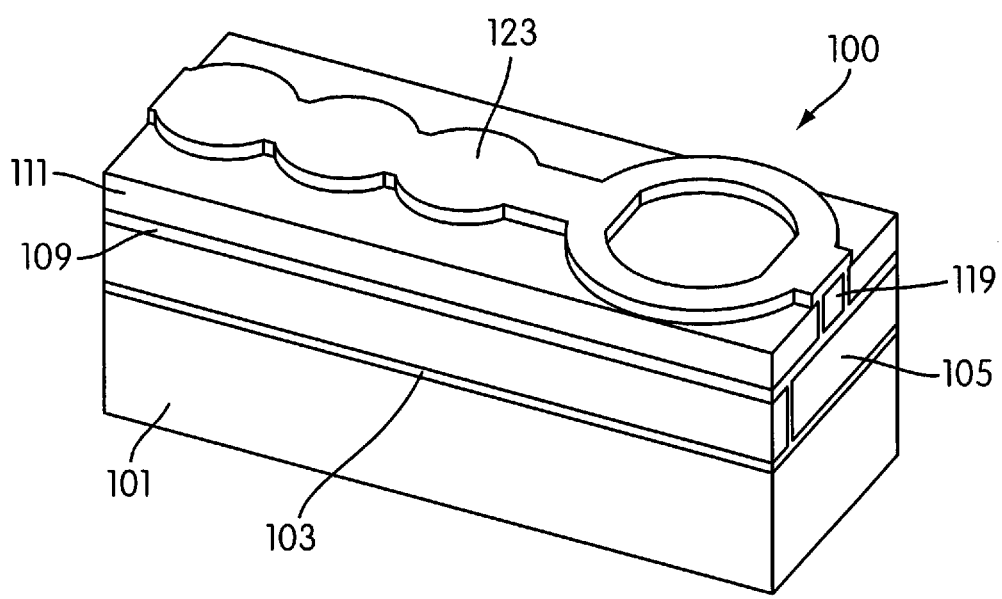
FIG. 8 is a perspective view of the device of FIG. 7 after the dielectric layer is etched to define a lateral electrical via.
Figure 9:
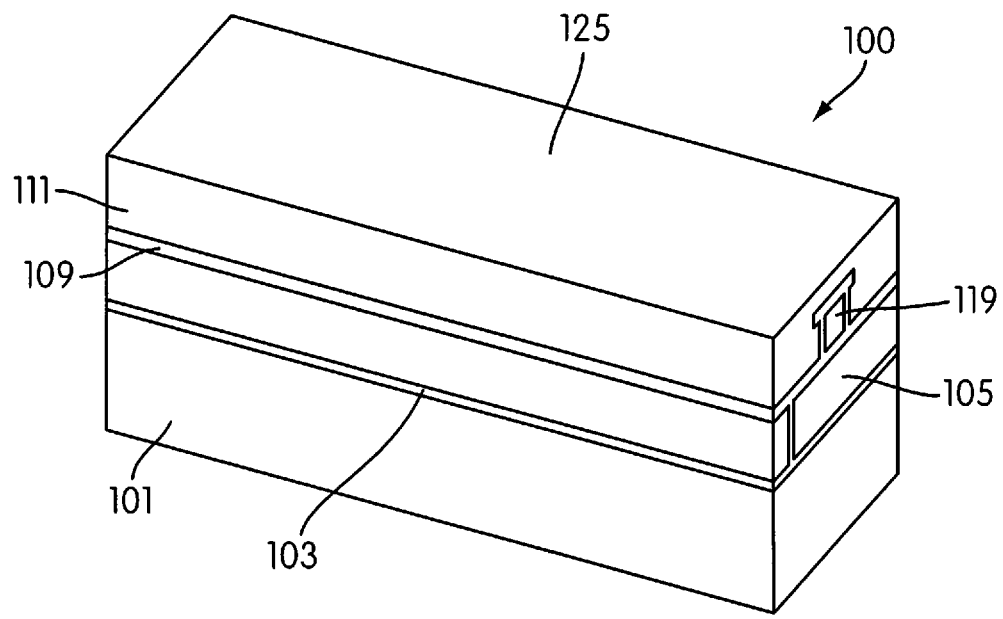
FIG. 9 is a perspective view of the device of FIG. 8 after the deposition of additional silicon to complete the cap layer and cover the dielectric material defining the lateral electrical via.
Figure 10:
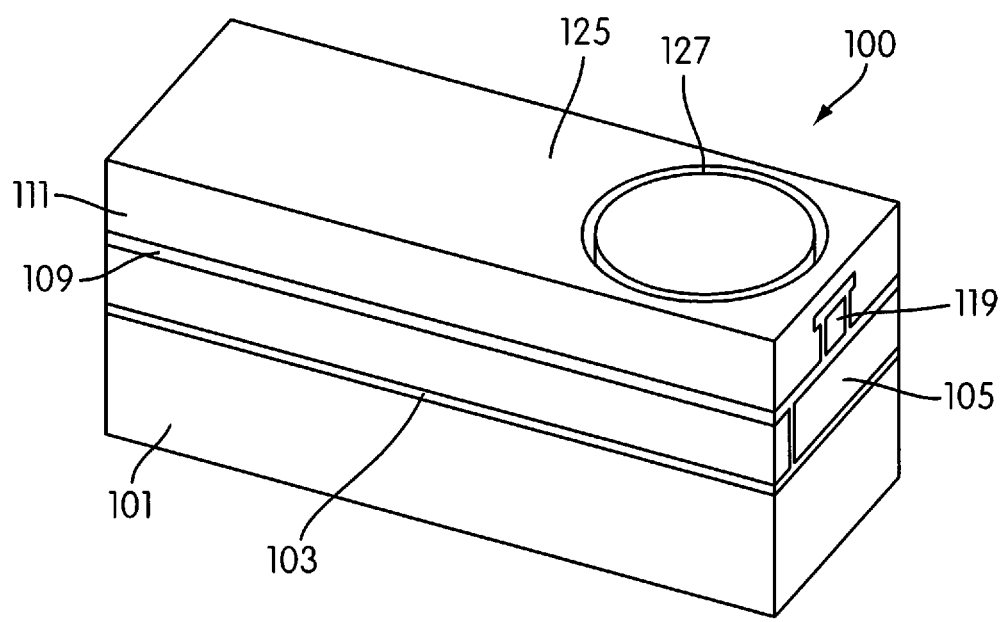
FIG. 10 is a perspective view of the device of FIG. 9 after the cap layer is etched to isolate an electrical contact.

The SiO$_2$ layer 121 and the dielectric material 117 are etched to again define the shape of the electrical via 119 and to provide a top isolating layer 123 for the electrical via (FIG. 8). In some embodiments, no further manufacturing of the device 100 is carried out, because the electrical via 119 is now isolated from the cap layer by the dielectric material 117. However, in other embodiments, additional doped silicon 125 is deposited on top of the top isolating layer 123 of the electrical via to complete the cap layer and encase the electrical via as illustrated in FIG. 9. The doped silicon 125 of the cap layer is then etched to isolate the large contact 127 from the cap layer material as shown in FIG. 10.

Figure 11:
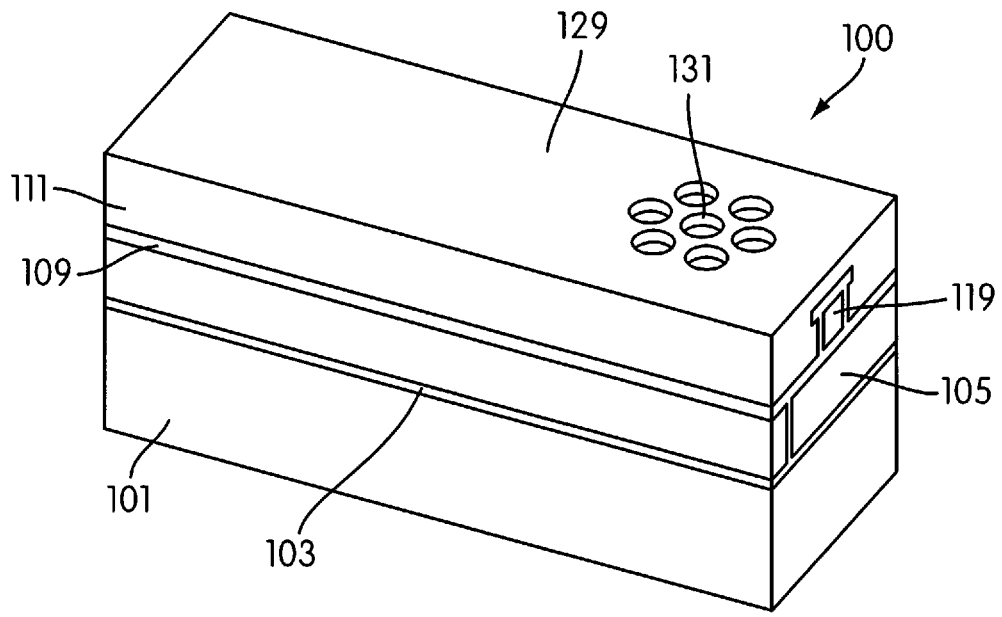
FIG. 11 is a perspective view of the device of FIG. 10 after deposition and patterning of a passivation material layer above the cap layer.

As illustrated in FIG. 11, a layer of a passivation material 129, such as an oxide, nitride, or other material suitable for the application, is deposited on the cap layer 111. Contact openings 131 are etched in the passivation material layer 129 to provide electrical access to the silicon via and, thereby, to the electrodes 107 of the device layer.

Figure 12:
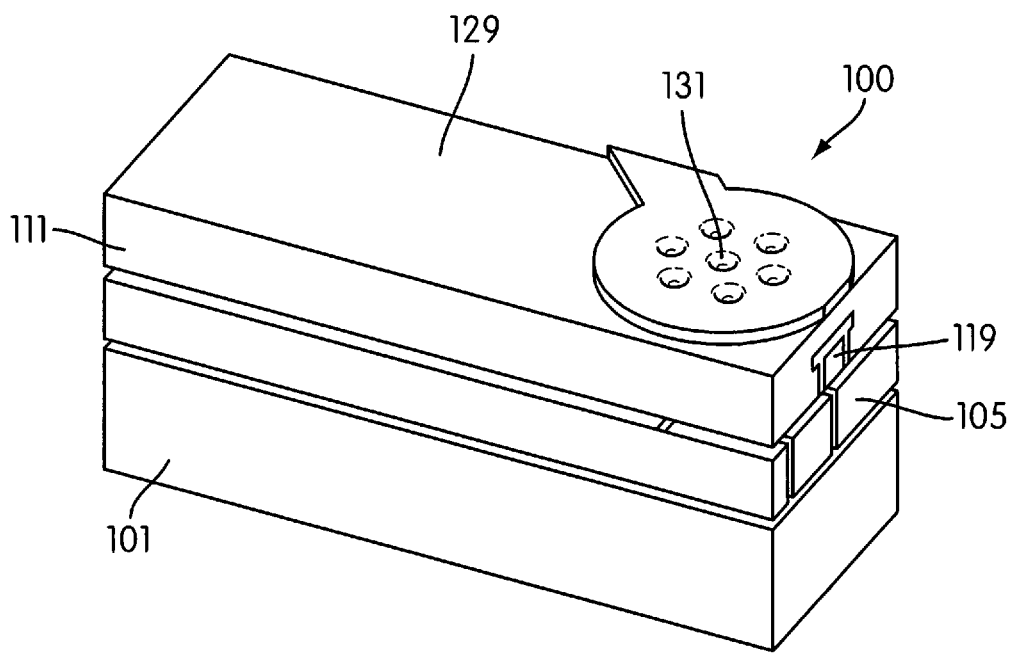
FIG. 12 is a perspective view of the device of FIG. 11 after releasing the sacrificial layers.
Figure 13:
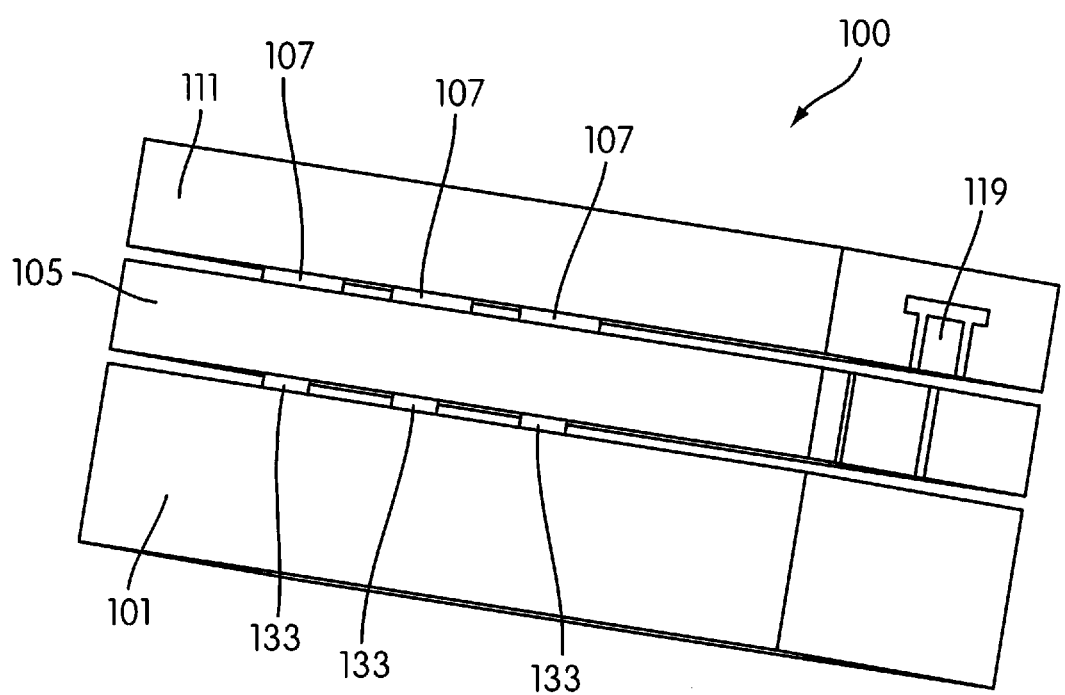
FIG. 13 is a side view of the device of FIG. 12.

FIG. 12 illustrates a MEMS device 100 including the lateral electrical via 119. A metal contact 131 is deposited, patterned, and etched to serve as an external contact to the electrodes 107. The buried oxide layer 103 and the sacrificial layer 109 are removed by a release etch. As a result of the release etch process, the lateral electrical via 119 is surrounded on three sides by dielectric material 117 and on the fourth side by an air gap (or vacuum) where the sacrificial layer previously was located. FIG. 13 provides a side view of the MEMS device 100. The isolated electrode contacts 107 are visible in the air gap between the cap layer 111 and the device layer 105. The electrode anchors 133 are visible between the device layer 105 and the silicon handle wafer 101.

In the device illustrated in FIGS. 12 and 13, the silicon electrical via is electrically isolated from the surrounding cap layer material. As a consequence, the electrodes 107 can be accessed by contacting the external metal electrode 131 on the top surface of the MEMS device 100.

In other variations of the process described above, the buried oxide layer 103 and the sacrificial layer 109 are not removed by release etching. In such constructions, the silicon via 119 is surrounded on three sides by the dielectric material 117 and on the bottom by the silicon dioxide layer 109. In another variation, another dielectric layer is deposited before the doped silicon 111 of the cap layer. This dielectric layer can be patterned to only remain under the electrical via 119, thus fully coating the via in the same type of dielectric material. In such variations, the dielectric material must be selected to withstand the release etch performed to release the sacrificial layer and the MEMS devices of the device layer 105. For example, a silicon-rich nitride could be used due to its resistance to HF etching.

Furthermore, in some variations, a current supplied to the lateral via generates heat. As such, the lateral via can be designed to act as a resistive heating element in the cap layer of the structure. In some embodiments where the lateral via is utilized as a resistive heating element, the lateral via is not electrically coupled to the MEMS layer.

Thus, the disclosure describes, among other things, a lateral electrical via in the cap layer of a MEMS device. The via provides shielded electrical access to small electrodes in devices created using encapsulation and packaging processes. Because the via is buried in the cap layer, exposure is minimized and the via can be electrically shielded.

What is claimed is:

1. A MEMS device structure, comprising:
 a MEMS device layer, including a MEMS device and one or more MEMS device layer electrodes;
 a cap layer positioned on the MEMS device layer, the cap layer covering the MEMS device and the one or more MEMS device layer electrodes, the cap layer including at least one cap layer electrode;
 an electrical via encased in the cap layer, the electrical via extending across a lateral distance from the cap layer electrode to the one or more MEMS device layer electrodes and electrically connecting the cap layer electrode to the one or more MEMS device layer electrodes; and an isolating layer positioned around the electrical via electrically isolating the electrical via from the cap layer.

2. The MEMS device structure of claim 1, further comprising:
a handle layer positioned adjacent to the MEMS device layer opposite the cap layer; and
one or more electrode anchors extending from each of the one or more MEMS device layer electrodes anchoring the one or more MEMS device layer electrodes in the handle layer.

3. The MEMS device structure of claim 1, wherein the electrical via is partially encased in the cap layer, and wherein the isolating layer covers all surfaces of the electrical via that are encased in the cap layer.

4. The MEMS device structure of claim 1, further comprising a first air gap between the cap layer and the MEMS device layer.

5. The MEMS device structure of claim 4, wherein a portion of the electrical via is exposed within the first air gap between the cap layer and the MEMS device layer.

6. The MEMS device structure of claim 4, wherein the MEMS device layer is connected to the cap layer by the one or more MEMS device layer electrodes that extend across the first air gap and contact the electrical via in the cap layer.

7. The MEMS device structure of claim 1, wherein the cap layer further includes a passivation material layer on a surface of the cap layer opposite the MEMS device layer.

8. The MEMS device structure of claim 7, wherein the cap layer electrode includes a metal contact mounted on the passivation layer of the cap layer and extending through the passivation layer to contact the electrical via.

9. The MEMS device structure of claim 1, wherein the cap layer electrode includes an exposed portion of the electrical via on the surface of the cap layer opposite the MEMS device layer.

10. A sensor package, comprising:
a MEMS device layer, including a first device and a second device;
a cap layer positioned on the MEMS device layer, the cap layer covering the at least one of the first and second devices, the cap layer including at least one cap layer electrode;
an electrical via encased in the cap layer, the electrical via extending across a lateral distance from the cap layer electrode to the at least one of the first and second devices and electrically connecting the cap layer electrode to the at least one of the first and second devices; and
an isolating layer positioned around the electrical via electrically isolating the electrical via from the cap layer.

11. The sensor package of claim 10, further comprising:
a handle layer positioned adjacent to the MEMS device layer opposite the cap layer; and
one or more electrode anchors extending from each of the at least one of the first and second devices anchoring the at least one of the first and second devices in the handle layer.

12. The sensor package of claim 10, wherein the electrical via is partially encased in the cap layer, and wherein the isolating layer covers all surfaces of the electrical via that are encased in the cap layer.

13. The sensor package of claim 12, wherein the MEMS device layer is connected to the cap layer by the at least one of the first and second devices that extend across the first air gap and contact the electrical via in the cap layer.

14. The sensor package of claim 13, wherein the first and second devices are selected from a group consisting of a MEMS device and a MEMS device layer electrode.

15. A MEMS device structure, comprising:
a MEMS device layer, including a MEMS device and one or more MEMS device layer electrodes;
a cap layer positioned on the MEMS device layer, the cap layer covering the MEMS device and the one or more MEMS device layer electrodes, the cap layer including at least one cap layer electrode;
an electrical via encased in the cap layer, the electrical via extending across a lateral distance from the cap layer electrode to the one or more MEMS device layer electrodes and electrically connecting the cap layer electrode to the one or more MEMS device layer electrodes;
an isolating layer positioned around the electrical via electrically isolating the electrical via from the cap layer;
a handle layer positioned adjacent to the MEMS device layer opposite the cap layer; and
one or more electrode anchors extending from each of the one or more MEMS device layer electrodes anchoring the one or more MEMS device layer electrodes in the handle layer.

16. The MEMS device structure of claim 15, wherein the electrical via is partially encased in the cap layer, and wherein the isolating layer covers all surfaces of the electrical via that are encased in the cap layer.

17. The MEMS device structure of claim 15, further comprising a first air gap between the cap layer and the MEMS device layer, and wherein the MEMS device layer is connected to the cap layer by the one or more MEMS device layer electrodes that extend across the first air gap and contact the electrical via in the cap layer.

18. The MEMS device structure of claim 15, wherein the cap layer further includes a passivation material layer on a surface of the cap layer opposite the MEMS device layer, and wherein the cap layer electrode includes a metal contact mounted on the passivation layer of the cap layer and extending through the passivation layer to contact the electrical via.

* * * * *